US009318612B2

(12) United States Patent
Seo et al.

(10) Patent No.: US 9,318,612 B2
(45) Date of Patent: Apr. 19, 2016

(54) ARRAY SUBSTRATE AND METHOD OF FABRICATING THE SAME (71) Applicant: LG Display Co., Ltd., Seoul (KR)

(72) Inventors: Hyun-Sik Seo, Goyang-si (KR); Kyung-Han Seo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/538,243

(22) Filed: Nov. 11, 2014

(65) Prior Publication Data

US 2015/0144943 A1 May 28, 2015

(30) Foreign Application Priority Data

Nov. 25, 2013 (KR) ........................ 10-2013-0143736

(51) Int. Cl.
*H01L 29/786* (2006.01)
*H01L 27/12* (2006.01)
*H01L 51/52* (2006.01)
*H01L 27/32* (2006.01)

(52) U.S. Cl.
CPC ...... *H01L 29/78606* (2013.01); *H01L 27/1225* (2013.01); *H01L 27/3244* (2013.01); *H01L 29/7869* (2013.01); *H01L 51/5253* (2013.01); *H01L 51/5259* (2013.01); *H01L 27/3262* (2013.01); *H01L 2227/323* (2013.01)

(58) Field of Classification Search
CPC .................................................. H01L 27/1237
See application file for complete search history.

(56) References Cited

U.S. PATENT DOCUMENTS

| 8,203,264 | B2 * | 6/2012 | Kang | .................. H01L 27/3258 257/59 |
| 2011/0079777 | A1 * | 4/2011 | Akimoto | ............. H01L 29/7869 257/43 |
| 2011/0220879 | A1 * | 9/2011 | Im | ....................... H01L 27/3258 257/40 |

OTHER PUBLICATIONS

Suresh et al., Transparent Indium Gallium Zinc Oxide Transistor Based Floating Gate Memory with Platinum Nanoparticles in the Gate Dielectric, Mar. 29, 2009, Applied Physics Letters 94, 123501.*

* cited by examiner

*Primary Examiner* — Matthew Reames
*Assistant Examiner* — Steven B Gauthier
(74) *Attorney, Agent, or Firm* — Dentons US LLP (57) ABSTRACT

An array substrate includes: a substrate; a thin film transistor including a gate electrode, an oxide semiconductor layer and source and drain electrodes, wherein a first insulating layer of an inorganic insulating material is disposed between the gate electrode and the oxide semiconductor layer, and wherein a second insulating layer of an inorganic insulating material is disposed between the oxide semiconductor layer and the source and drain electrodes; a passivation layer on the thin film transistor; a first electrode on the passivation layer in the pixel region; and a first hydrogen absorbing layer on at least one of top and bottom surfaces of the first insulating layer, top and bottom surfaces of the second insulating layer and top and bottom surfaces of the passivation layer, the first hydrogen absorbing layer including plurality of particles spaced apart from each other and including one of nickel, palladium and platinum.

20 Claims, 8 Drawing Sheets

ARRAY SUBSTRATE AND METHOD OF FABRICATING THE SAME

CROSS-REFERENCE TO RELATED APPLICATION

This application claims the benefit under 35 U.S.C. §119(a) of Korean Patent Application No. 10-2013-0143736, filed on Nov. 25, 2013, in the Korean Intellectual Property Office, which is incorporated herein by reference in its entirety.

BACKGROUND OF THE INVENTION

1. Field of the Invention

The present disclosure relates to an array substrate. More particularly, the disclosure relates to an array substrate in which deterioration of an oxide semiconductor layer of a thin film transistor is prevented by blocking inflow of hydrogen into the oxide semiconductor layer, and a method of fabricating the same.

2. Discussion of the Related Art

As an information-based society progresses, display devices processing and displaying a large amount of information has rapidly advanced and various flat panel displays (FPDs) have been developed. Specifically, FPDs such as a liquid crystal display (LCD) device, a plasma display panel (PDP) device, an organic light emitting diode (OLED) display device and a field emission display (FED) device having a superior performance with a thin profile, a light weight, and a low power consumption have replaced the cathode ray tube (CRT).

Among various FPDs, the LCD device having a high contrast ratio, an advantage in displaying a moving image and a low power consumption has been used in various fields such as a notebook, a monitor and a television. The LCD device uses an optical anisotropy and a polarization property of a liquid crystal molecule. Since the liquid crystal molecule has a long and thin profile, the liquid crystal molecule has an optical anisotropy of an orientation in arrangement and a polarization such that an arrangement direction of the liquid crystal molecule is changed according to an intensity of an electric field.

In addition, the OLED display device has superior properties such as a high brightness and an ability to be driven by a low voltage. Since the OLED display device has an emissive type, the OLED display device has a high contrast ratio and a thin profile. The OLED display device has an advantage in displaying a moving image due to a short response time of several micro seconds (μsec). The OLED display device has no limitation on a viewing angle and is stable even in a low temperature. Since the OLED display device is driven by a low voltage of 5V to 15V in direct current (DC), it is easy to fabricate and design a driving circuit.

The LCD device and the OLED display device include an array substrate having a thin film transistor (TFT) for turning on and off a pixel region. A gate line and a data line crossing each other to define the pixel region are formed on the array substrate. In addition, at least one TFT is formed in the pixel region. The TFT functions as a switching element for turning on and off the pixel region and as a driving element for driving the pixel region to display an image. Specifically, at least two TFTs are formed in the pixel region of the array substrate for an OLED display device.

The TFT in the pixel region has various structures according to a material for a semiconductor layer. The semiconductor layer may include one of amorphous silicon, an oxide semiconductor material and polycrystalline silicon, and the array substrate includes the TFT having a top gate structure or a bottom gate structure according to the material for the semiconductor layer.

Among the TFTs having the semiconductor layer of various materials, the TFT having an oxide semiconductor layer of an oxide semiconductor material has been the subject of recent research.

The TFT having the oxide semiconductor layer has superior conductivity of carriers to the TFT having the semiconductor layer of amorphous silicon. In addition, the TFT having the oxide semiconductor layer has a simplified fabrication process as compared with the TFT having a polycrystalline silicon semiconductor layer requiring a doping with impurities.

However, the array substrate having the oxide TFT includes a plurality of insulating layers of an organic material or an inorganic material such as a gate insulating layer, an etch stopper and a passivation layer over or under the oxide semiconductor layer. In addition, the array substrate for an OLED display device further includes a planarization layer and a bank layer.

The plurality of insulating layers, specifically the insulating layers of silicon nitride, have a large amount of hydrogen and the hydrogen of the plurality of insulating layers is diffused into the oxide semiconductor layer. As a result, the oxide semiconductor layer is deteriorated by the hydrogen and a lifetime of the oxide semiconductor layer is reduced. In addition, since the hydrogen changes the oxide semiconductor layer into a conductor, the oxide semiconductor layer does not function as a semiconductor layer. As a result, a property of the TFT having the oxide semiconductor layer is deteriorated.

Further, the current and voltage property of the TFT is shifted along a negative direction (negative threshold voltage shift). When the current and voltage property of the TFT is shifted along a negative direction, light emitting diodes using the TFT as a driving element have different emission brightness properties according to a position in the OLED display device and the display quality of the OLED display device is deteriorated due to the non-uniformity in brightness.

SUMMARY OF THE INVENTION

Embodiments of the present invention relate to an array substrate and a method of fabricating the array substrate. Accordingly, one exemplary embodiment is directed to an array substrate that substantially obviates one or more problems due to limitations and disadvantages of the related art.

One exemplary embodiment is an array substrate, where diffusion of hydrogen from an insulating layer into an oxide semiconductor layer is restrained so that deterioration of the oxide semiconductor layer can be prevented and deterioration of a property of a thin film transistor can be prevented, and a method of fabricating the array substrate.

In addition, one exemplary embodiment is an array substrate, where diffusion of hydrogen from an insulating layer into an oxide semiconductor layer is restrained so that a negative shift of a current and voltage property of a thin film transistor can be prevented, and a method of fabricating the array substrate.

Advantages and features of the disclosure will be set forth in part in the description, which follows and in part will become apparent to those having ordinary skill in the art upon examination of the following or may be learned from practice of the invention. Other advantages and features of the embodiments herein may be realized and attained by the structure particularly pointed out in the written description and claims hereof as well as the appended drawings.

To achieve other advantages and features in accordance with the purpose according to one aspect of the invention, one exemplary embodiment is an array substrate including: a substrate including a pixel region; a thin film transistor in the pixel region, the thin film transistor including a gate electrode, an oxide semiconductor layer and source and drain electrodes spaced apart from each other, wherein a first insulating layer of an inorganic insulating material is disposed between the gate electrode and the oxide semiconductor layer, and wherein a second insulating layer of an inorganic insulating material is disposed between the oxide semiconductor layer and the source and drain electrodes; a passivation layer on the thin film transistor, the passivation layer having a drain contact hole exposing the drain electrode; a first electrode on the passivation layer in the pixel region, the first electrode connected to the drain electrode through the drain contact hole; and a first hydrogen absorbing layer on at least one of top and bottom surfaces of the first insulating layer, top and bottom surfaces of the second insulating layer and top and bottom surfaces of the passivation layer, the first hydrogen absorbing layer including plurality of particles spaced apart from each other, the plurality of particles including one of nickel, palladium and platinum.

In another aspect, one exemplary embodiment is a method of fabricating an array substrate, including: forming a thin film transistor in a pixel region on a substrate, the thin film transistor including a gate electrode, an oxide semiconductor layer and source and drain electrodes spaced apart from each other, wherein a first insulating layer of an inorganic insulating material is disposed between the gate electrode and the oxide semiconductor layer, and wherein a second insulating layer of an inorganic insulating material is disposed between the oxide semiconductor layer and the source and drain electrodes; forming a passivation layer on the thin film transistor, the passivation layer having a drain contact hole exposing the drain electrode; forming a first electrode on the passivation layer in the pixel region, the first electrode connected to the drain electrode through the drain contact hole; and forming a first hydrogen absorbing layer on at least one of top and bottom surfaces of the first insulating layer, top and bottom surfaces of the second insulating layer and top and bottom surfaces of the passivation layer, the first hydrogen absorbing layer including plurality of particles spaced apart from each other, the plurality of particles including one of nickel, palladium and platinum.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention, are incorporated in and constitute a part of this specification, illustrate implementations of the invention and together with the description serve to explain the principles of the invention.

DETAILED DESCRIPTION OF THE ILLUSTRATED EMBODIMENTS

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

FIGS. 1A to 1M are cross-sectional views showing a method of fabricating an array substrate according to a first embodiment of the present invention.

Figure 1A:
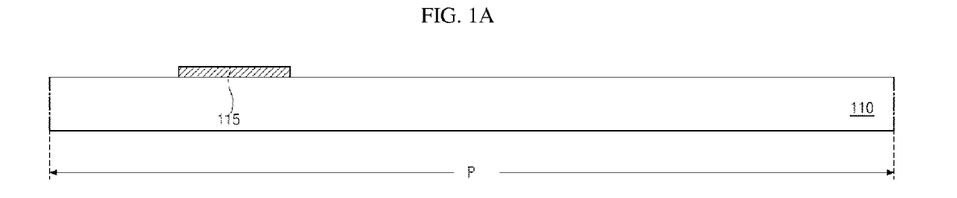
FIGS. 1A to 1M are cross-sectional views showing a method of fabricating an array substrate according to a first embodiment of the present invention.

In FIG. 1A, after a first metal layer (not shown) is formed on a substrate 110 by depositing a metallic material, a gate line (not shown) and a gate electrode 115 connected to the gate line are formed on the substrate 110 by patterning the first metal layer through a photolithographic process. The substrate 110 may include a transparent insulating material such as a glass or a plastic. The metallic material for the gate line and the gate electrode 115 may include at least one of copper (Cu), copper alloy, aluminum (Al), aluminum alloy (e.g., aluminum neodymium (AlNd)), molybdenum (Mo) and molybdenum alloy (e.g., molybdenum titanium (MoTi)). The gate line and the gate electrode 115 may have a single-layered structure or a multiple-layered structure. The photolithographic process may include a coating step of a photoresist, an exposure step using a photo mask, a developing step of the exposed photoresist, an etching step of the first metal layer using a photoresist pattern and a stripping step of the photoresist pattern.

Figure 1B:
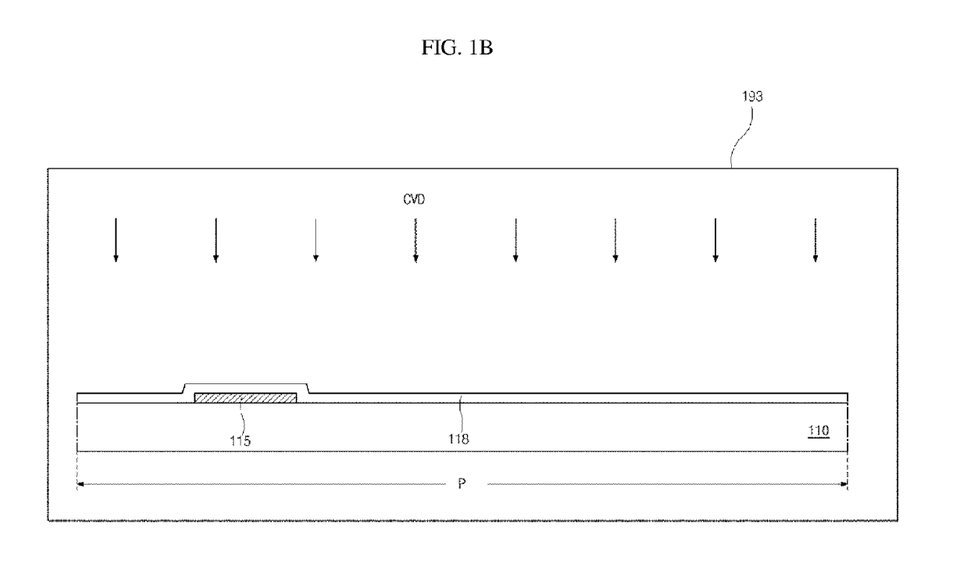

In FIG. 1B, after the substrate 110 having the gate line and the gate electrode 115 is disposed in a chamber 193 of a chemical vapor deposition (CVD) apparatus, a gate insulating layer 118 of silicon oxide ($SiO_2$) or silicon nitride (SiNx) is formed on the entire substrate 110 by generating a plasma with reaction gases. For example, the reaction gases may include a mixture of silane ($SiH_4$) and nitrous oxide ($N_2O$) or a mixture of silane ($SiH_4$) and ammonia ($NH_3$).

Figure 1C:
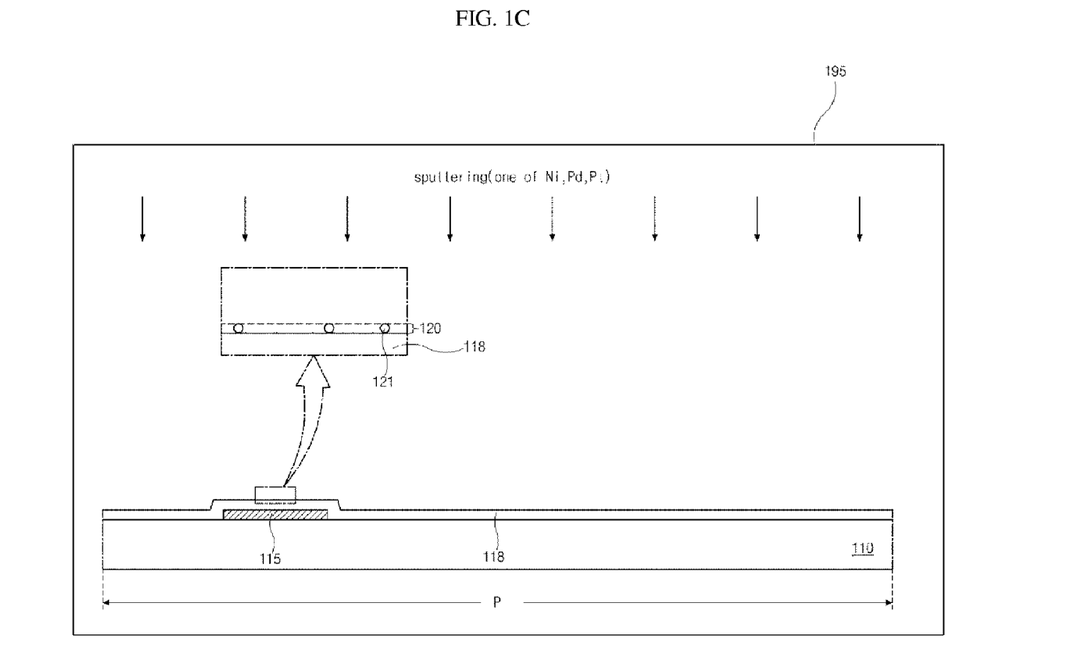

In FIG. 1C, a first hydrogen absorbing layer 120 is formed on the gate insulating layer 118 of silicon oxide ($SiO_2$) or silicon nitride (SiNx) by depositing a metallic material such as nickel (Ni), palladium (Pd) and platinum (Pt). The first hydrogen absorbing layer 120 may have a thickness of about 0.1 Å to about 9 Å, preferably about 0.1 Å to about 5 Å.

The first hydrogen absorbing layer 120 may be formed in a chamber 195 of a sputtering apparatus. The first hydrogen absorbing layer 120 of about 9 Å may not be inspected by the naked eye and may be detected by an analyzer for a metallic material. Accordingly, the first hydrogen absorbing layer 120 may not be formed to have a uniform thickness of about 0.1 Å to about 9 Å. Instead, the first hydrogen absorbing layer 120 may be formed to have particles 121 of the metallic material.

Since the first hydrogen absorbing layer 120 includes particles 121 separated from each other, the first hydrogen absorbing layer 120 does not have electrical conductivity. For example, even when a voltage is applied to two points of the first hydrogen absorbing layer 120, a current does not flow between the two points because the particles 121 are not electrically connected to each other.

Figure 1D:
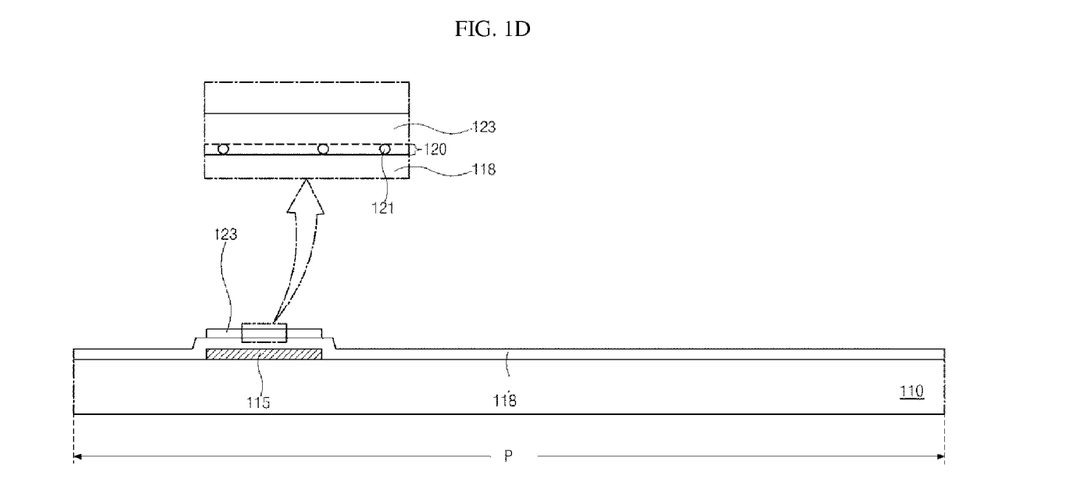

The first hydrogen absorbing layer 120 of the metallic material such as nickel (Ni), palladium (Pd) and platinum (Pt) may absorb the hydrogen diffused from an insulating layer such as the gate insulating layer 118 to restrain permeation of the hydrogen into an oxide semiconductor layer 123 (of FIG. 1D).

The metallic material for the first hydrogen absorbing layer 120 may have a high affinity with the hydrogen. When the metallic material for the first hydrogen absorbing layer 120 meets the hydrogen, the metallic material for the first hydrogen absorbing layer 120 may combine with the hydrogen to constitute an interstitial compound storing the hydrogen. For example, each of nickel (Ni), palladium (Pd) and platinum (Pt) may absorb and store the hydrogen of about 10 times to about 900 times of a volume thereof. When the metallic material for the first hydrogen absorbing layer 120 absorbs the hydrogen to constitute an interstitial compound, conductivity of the metallic material is nearly removed such that the metallic material of an interstitial compound has an insulation property.

Accordingly, since the first hydrogen absorbing layer 120 is formed to have the particles separated from each other, the first hydrogen absorbing layer 120 does not have conductivity. In addition, since the first hydrogen absorbing layer 120 absorbs the hydrogen from the gate insulating layer 118 to constitute an interstitial compound, the first hydrogen absorbing layer 120 has an insulation property.

Although the first hydrogen absorbing layer 120 is formed on the gate insulating layer 118 in the first embodiment, the first hydrogen absorbing layer may be formed between the gate electrode 115 and the gate insulating layer 118 in another embodiment. For example, the first hydrogen absorbing layer may be formed on the entire substrate having the gate line and the gate electrode 115. Alternatively, after the first hydrogen absorbing layer may be formed on the entire substrate having the first metal layer, the first metal layer and the first hydrogen absorbing layer may be patterned such that the first hydrogen absorbing pattern is selectively formed on the gate line and the gate electrode 115. In addition, the first hydrogen absorbing layer may be formed over and under the gate insulating layer 118 in another embodiment.

Before or after an insulating layer of an inorganic insulating material including the hydrogen is formed, the first hydrogen absorbing layer 120 of a metallic material having a high affinity with the hydrogen such as nickel (Ni), palladium (Pd) and platinum (Pt) is formed under or over the insulating layer to include the particles 121 separated from each other. The first hydrogen absorbing layer 120 may be formed adjacent to the oxide semiconductor layer 123 (of FIG. 1D) so that permeation of the hydrogen into the oxide semiconductor layer 123 can be prevented by the first hydrogen absorbing layer 120.

In FIG. 1D, after an oxide semiconductor material layer (not shown) is formed on the first hydrogen absorbing layer 120 by depositing an oxide semiconductor material, an oxide semiconductor layer 123 of an island shape is formed on the first hydrogen absorbing layer 120 over the gate electrode 115 by patterning the oxide semiconductor material layer through a photolithographic process. The oxide semiconductor material may include one of indium gallium zinc oxide (IGZO), zinc tin oxide (ZTO) and zinc indium oxide (ZIO).

A carrier concentration of the oxide semiconductor layer 123 changes according to an amount of oxygen vacancy of the oxide semiconductor layer 123, and a charging property of a thin film transistor (TFT) having the oxide semiconductor layer 123 changes according to the carrier concentration. In addition, when the hydrogen is permeated into the oxide semiconductor layer 123 during a fabrication process or after the fabrication process, conductivity of the oxide semiconductor layer 123 increases such that a semiconductor property of the oxide semiconductor layer 123 is deteriorated. As a result, an inherent property of the TFT such as a switching property and a driving property is deteriorated.

Further, when the hydrogen is permeated into the oxide semiconductor layer 123, a current voltage property of the TFT having the oxide semiconductor layer 123 is shifted along a negative direction in a current voltage characteristic graph (negative threshold voltage (Vth) shift) and brightness of a display device is deteriorated.

In the array substrate according to the first embodiment of the present invention, however, since the first hydrogen absorbing layer 120 having the particles 121 of one of nickel (Ni), palladium (Pd) and platinum (Pt) restrains permeation of the hydrogen from the gate insulating layer 118 into the oxide semiconductor layer 123, the deterioration in property of the TFT is prevented.

Figure 1E:
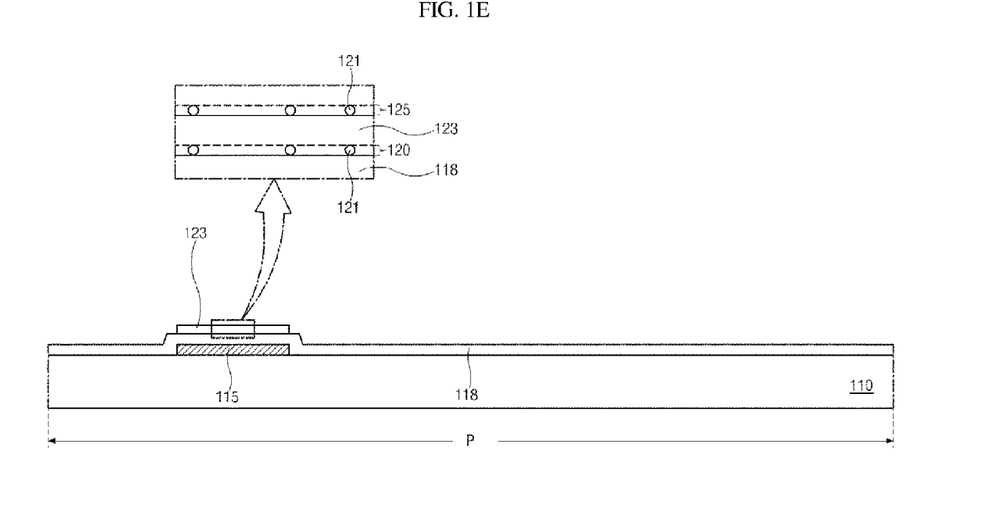

In FIG. 1E, a second hydrogen absorbing layer 125 is formed on the oxide semiconductor layer 123 by depositing a metallic material such as nickel (Ni), palladium (Pd) and platinum (Pt). The second hydrogen absorbing layer 125 may have a thickness of about 0.1 Å to about 9 Å, preferably about 0.1 Å to about 5 Å, such that the second hydrogen absorbing layer 125 includes particles 121 of the metallic material separated from each other.

Although the second hydrogen absorbing layer 125 is formed on the oxide semiconductor layer 123 in the first embodiment, the second hydrogen absorbing layer may be formed on an etch stopper 128 (of FIG. 1F) of an inorganic insulating material in another embodiment.

Figure 1F:
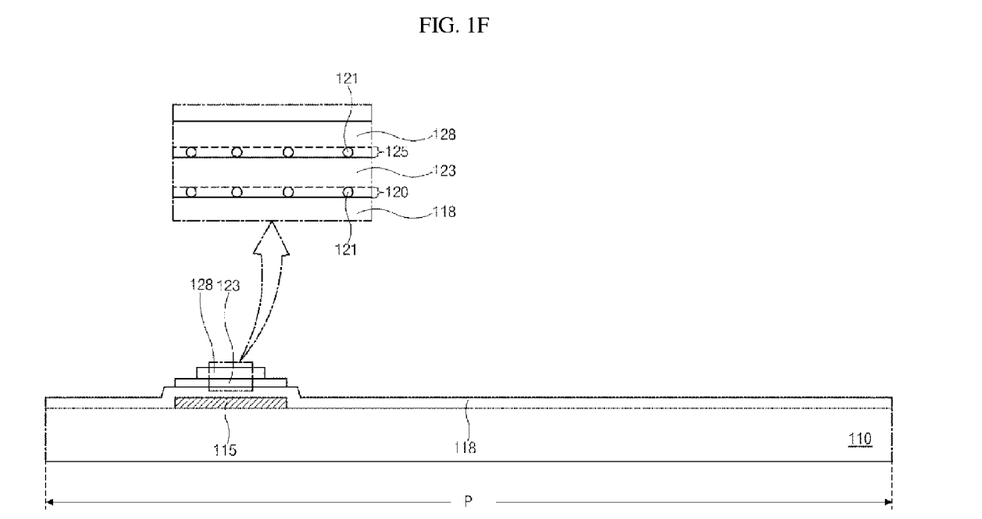

In FIG. 1F, after an inorganic insulating material layer (not shown) is formed on the entire substrate having the oxide semiconductor layer 123 by depositing an inorganic insulating material, an etch stopper 128 of an island shape is formed on the oxide semiconductor layer 123 by patterning the inorganic insulating material layer through a photolithographic process. The inorganic insulating material may include silicon oxide ($SiO_2$).

Although the etch stopper 128 has an island shape covering a central portion of the oxide semiconductor layer 123 and exposing end portions of the oxide semiconductor layer 123 in the first embodiment, the etch stopper may have a plate shape covering an entire surface of the substrate 110 having the oxide semiconductor layer 123 with semiconductor contact holes exposing the end portions of the oxide semiconductor layer 123 in another embodiment. In addition, after the etch stopper 128 is formed, a third hydrogen absorbing layer of one of nickel (Ni), palladium (Pd) and platinum (Pt) may be formed on the etch stopper 128 in another embodiment.

Figure 1G:
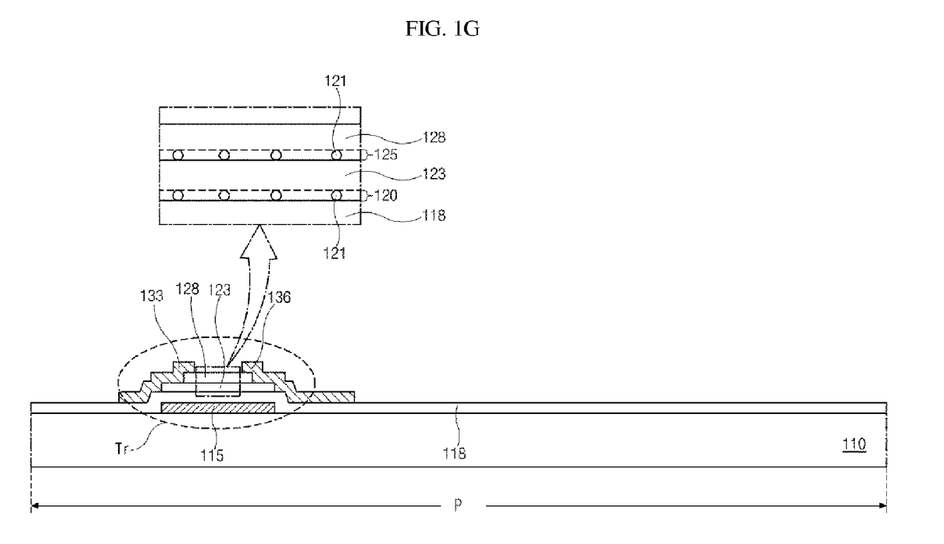

In FIG. 1G, after a second metal layer (not shown) is formed on the etch stopper 128 by depositing a metallic material, a data line (not shown), a source electrode 133 and a drain electrode 136 are formed by patterning the second metal layer through a photolithographic process. The data line crosses the gate line to define a pixel region P, and the source and drain electrodes 133 and 136 are spaced apart from each other on the etch stopper 128. The metallic material for the data line, the source electrode 133 and the drain electrode 136 may include at least one of copper (Cu), copper alloy, aluminum (Al), aluminum alloy (e.g., aluminum neodymium (AlNd)), molybdenum (Mo) and molybdenum alloy (e.g., molybdenum titanium (MoTi)). The data line, the source electrode 133 and the drain electrode 136 may have a single-layered structure or a multiple-layered structure.

The source and drain electrodes 133 and 136 contact the end portions of the oxide semiconductor layer 123 exposed outside the etch stopper 128. When the etch stopper 128 has the semiconductor contact holes exposing the end portions of the oxide semiconductor layer 123, the source and drain electrodes 133 and 136 may contact the end portions of the oxide semiconductor layer 123 through the semiconductor contact holes.

The gate electrode 115, the gate insulating layer 118, the first hydrogen absorbing layer 120, the oxide semiconductor layer 123, the etch stopper 128, the source electrode 133 and the drain electrode 136 constitute a thin film transistor (TFT) Tr.

Although not shown, the TFT Tr may be a driving TFT of an array substrate for an organic light emitting diode (OLED) display device and a switching TFT having the same structure as the driving TFT may be formed on the array substrate for an OLED display device. In addition, the TFT Tr may be a switching TFT of an array substrate for a liquid crystal display (LCD) device. The switching TFT of the array substrate for an OLED display device or an LCD device may have a gate electrode connected to a gate line and a source electrode connected to a data line. Further, the array substrate for an OLED display device may include a power line which is parallel to the gate line or the data line and has the same layer as the gate line or the data line.

Figure 1H:
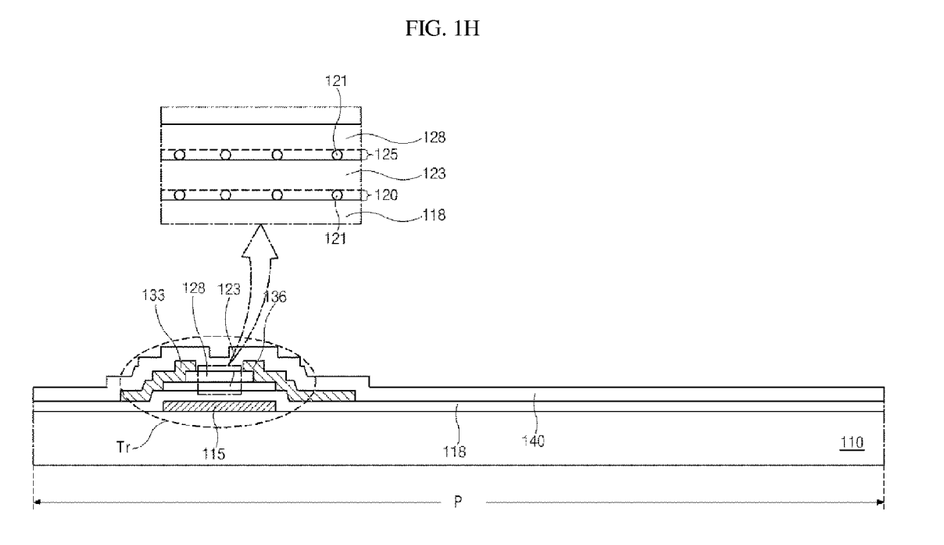

In FIG. 1H, a passivation layer 140 is formed on the TFT Tr by depositing an inorganic insulating material such as silicon oxide ($SiO_2$) or silicon nitride (SiNx). In another embodiment, a third hydrogen absorbing layer may be formed under or over the passivation layer 140 in another embodiment.

Figure 1I:
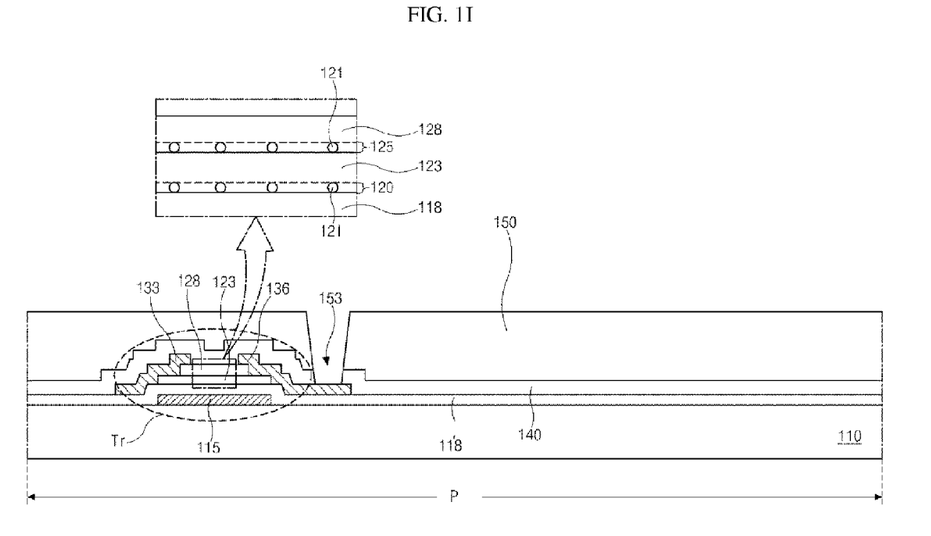

In FIG. 1I, after a planarization layer 150 having a flat top surface is formed on the passivation layer by depositing an organic insulating material such as photoacryl, the planarization layer 150 and the passivation layer 140 are patterned to form a drain contact hole 153 exposing the drain electrode 136 of the TFT Tr.

Figure 1J:
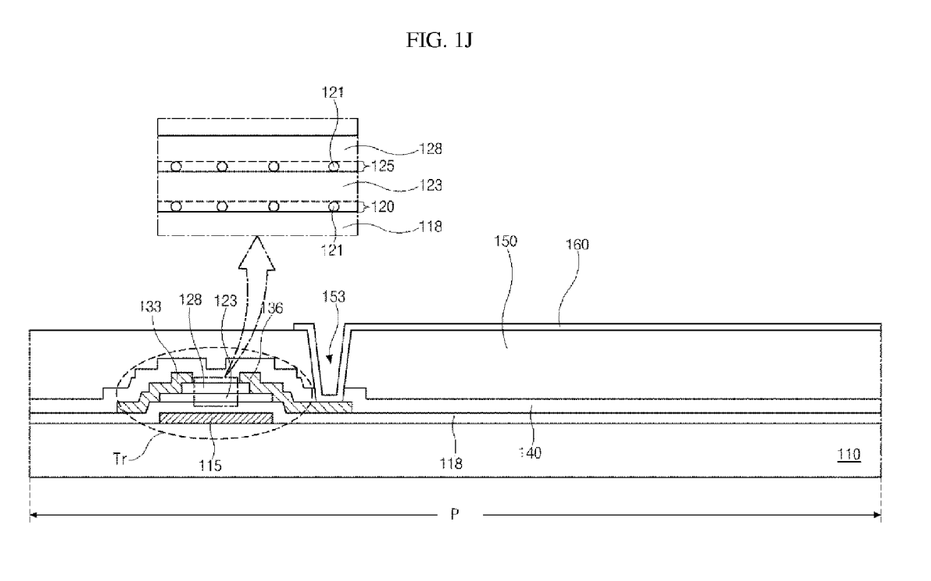

In FIG. 1J, after a transparent conductive material layer (not shown) or a third metal layer (not shown) is formed on the planarization layer 150 by depositing a transparent conductive material or a metallic material, a first electrode 160 is formed in the pixel region P by patterning the transparent conductive material layer or the third metal layer through a photolithographic process. The transparent conductive material may include indium tin oxide (ITO) having a relatively high work function and the metallic material may include one of aluminum (Al), aluminum alloy, silver (Ag), magnesium (Mg) and gold (Au). The first electrode 160 is connected to the drain electrode 136 of the TFT Tr through the drain contact hole 153.

Figure 1K:
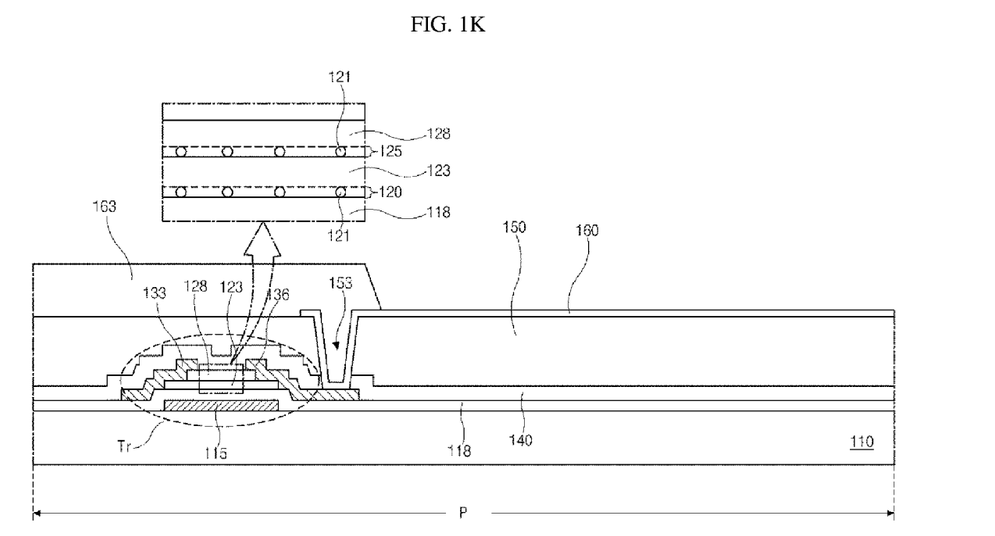

In FIG. 1K, after an organic insulating material layer (not shown) is formed on the first electrode 160 by coating an organic insulating material, a bank layer 163 is formed on the first electrode 160 and the planarization layer 150 by patterning the organic material layer through a photolithographic process. The organic insulating material may include polyimide or resin. The bank layer 163 may cover a boundary portion of the first electrode 160 and may expose a central portion of the first electrode 160.

Figure 1L:
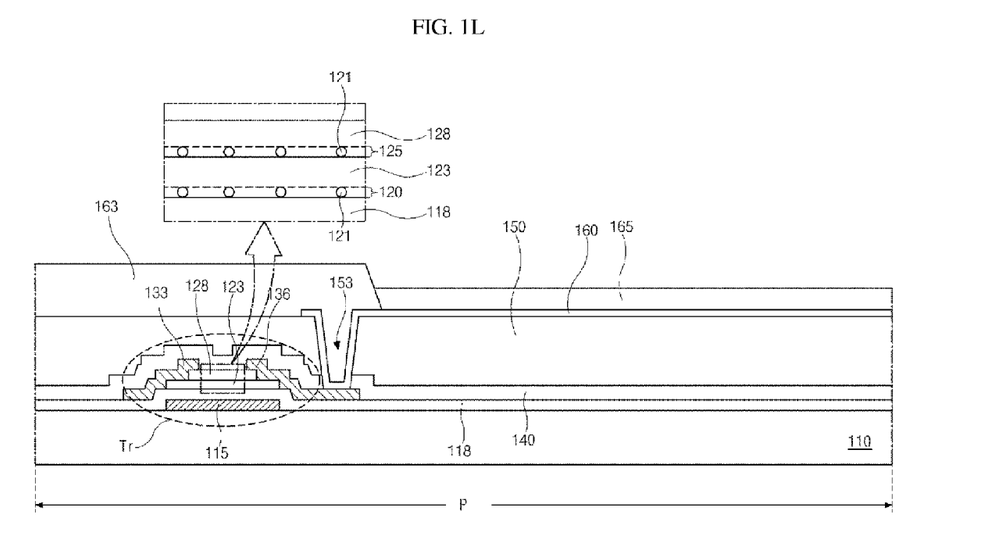

In FIG. 1L, an emitting material layer 165 is formed on the first electrode 160 exposed through the bank layer 163. The emitting material layer 165 may be formed by a thermal evaporation method using a shadow mask, by an ink jet method or by a nozzle coating method. The emitting material layer 165 may include different materials in different pixel regions to emit red, green and blue colored lights or red, green, blue and white colored lights.

Although not shown, a first auxiliary emitting layer of a single-layered structure or a multiple-layered structure may be formed under the emitting material layer 165, and a second auxiliary emitting layer of a single-layered structure or a multiple-layered structure may be formed over the emitting material layer 165. When the first electrode 160 is an anode of a light emitting diode E (of FIG. 1M), the first auxiliary emitting layer may include a hole injecting layer and a hole transporting layer sequentially formed on the first electrode 160, and the second auxiliary emitting layer may include an electron transporting layer and an electron injecting layer sequentially formed on the emitting material layer 165.

In another embodiment, the first auxiliary emitting layer may include one of a hole injecting layer and a hole transporting layer, and the second auxiliary emitting layer may include one of an electron transporting layer and an electron injecting layer. In another embodiment, the first auxiliary emitting layer may further include an electron blocking layer, and the second auxiliary emitting layer may further include a hole blocking layer. In addition, when the first electrode 160 is a cathode of a light emitting diode E, the first auxiliary emitting layer may be formed over the emitting material layer 165 and the second auxiliary emitting layer may be formed under the emitting material layer 165.

Figure 1M:
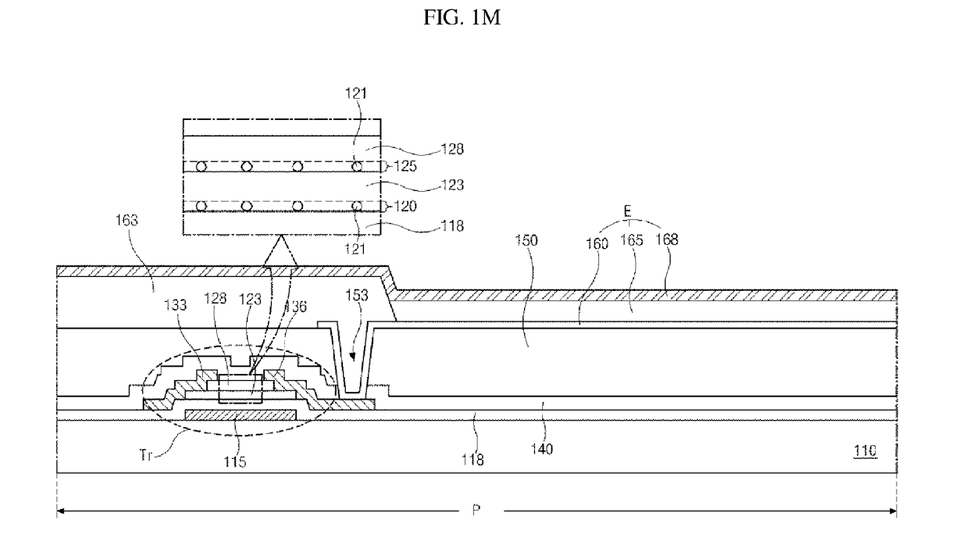

In FIG. 1M, after a transparent conductive material layer (not shown) or a fourth metal layer (not shown) is formed on the emitting material layer 165 by depositing a transparent conductive material or a metallic material, a second electrode 168 is formed on an entire surface of the substrate 110 by patterning the transparent conductive material layer or the fourth metal layer through a photolithographic process. The transparent conductive material may include indium tin oxide (ITO) having a relatively high work function and the metallic material may include one of aluminum (Al), aluminum alloy, silver (Ag), magnesium (Mg) and gold (Au).

The first electrode 160, the emitting material layer 165 and the second electrode 168 constitute a light emitting diode E. Although not shown, a color filter layer may be formed in the pixel region P between the passivation layer 140 and the planarization layer 150. The color filter layer may include red, green and blue color filters sequentially and repeatedly disposed in the pixel region P.

When the color filter layer is formed between the passivation layer 140 and the planarization layer 150, the emitting material layer 165 may be formed on an entire surface of the substrate 110 to emit a white colored light and the OLED display device may display a full color image by using the light through the red, green and blue color filters. In another embodiment, the array substrate may have a pixel region where the color filter layer is not formed to display a white color and the OLED display device may display an image by using red, green, blue and white colored lights to improve contrast ratio.

When the substrate 110 is an array substrate for an LCD device, the bank layer 163, the emitting material layer 165 and the second electrode 168 are omitted, and the first electrode 160 may be formed on the passivation layer 140 without the planarization layer 150. In addition, an insulating layer and a common electrode may be sequentially formed on the first electrode 160, and the common electrode may have a plurality of openings each having a bar shape.

In the array substrate according to a first embodiment of the present invention, the hydrogen absorbing layer 120 and 125 of a metallic material having a relatively high affinity with a hydrogen may be formed under or over the inorganic insulating layer 118 and 128 having a hydrogen. The hydrogen absorbing layer 120 and 125 may include one of nickel (Ni), palladium (Pd) and platinum (Pt). In addition, the hydrogen absorbing layer 120 and 125 may have a thickness of about 0.1 Å to about 9 Å, preferably about 0.1 Å to about 5 Å, to have particles 121 separated from each other. Since the hydrogen from the inorganic insulating layer 118 and 128 is absorbed by the hydrogen absorbing layer 120 and 125, permeation of the hydrogen from the inorganic insulating layer 118 and 128 into the oxide semiconductor layer 123 is restrained. As a result, deterioration of an oxide semiconductor layer 123 due to inflow of the hydrogen is prevented and deterioration in property of the TFT Tr is prevented. Further, since a negative shift of a current and voltage property of the TFT Tr is prevented, deterioration in display quality due to ununiform brightness is prevented.

Figure 2:
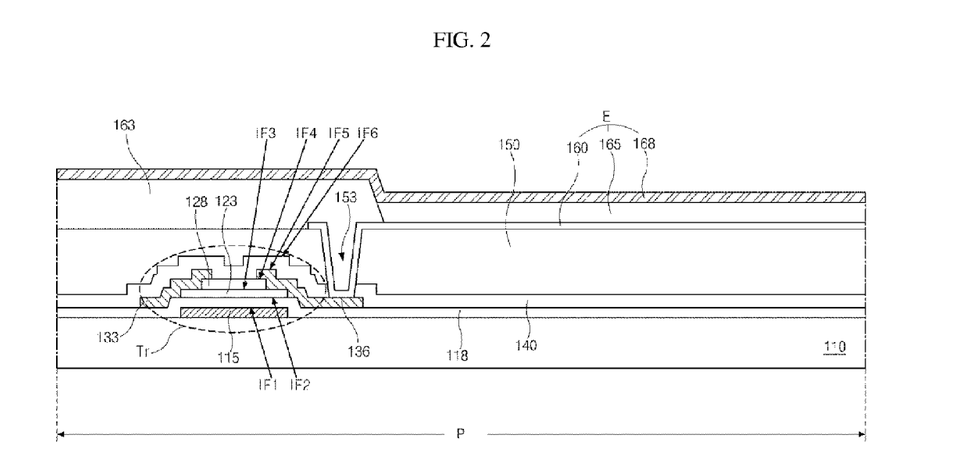
FIG. 2 is a cross-sectional view showing interfaces for a hydrogen absorbing layer of an array substrate according to a first embodiment of the present invention.

FIG. 2 is a cross-sectional view showing interfaces for a hydrogen absorbing layer of an array substrate according to a first embodiment of the present invention.

In FIG. 2, a hydrogen absorbing layer may be formed in at least one of a first interface IF1 between the gate electrode 115 and the gate insulating layer 118, a second interface IF2 between the gate insulating layer 118 and the oxide semiconductor layer 123, a third interface IF3 between the oxide semiconductor layer 123 and the etch stopper 128, a fourth interface IF4 between the etch stopper 128 and the source and drain electrodes 133 and 136, a fifth interface IF5 between the source and drain electrodes 133 and 136 and the passivation layer 140 and a sixth interface IF6 between the passivation layer 140 and the planarization layer 150. Accordingly, the hydrogen absorbing layer may be formed on at least one of top and bottom surfaces of the gate insulating layer 118, top and bottom surfaces of the etch stopper 128 and top and bottom surfaces of the passivation layer 140.

For example, the hydrogen absorbing layer may be formed in at least one of the first and second interfaces IF1 and IF2 under the oxide semiconductor layer 123 and in at least one of the third to sixth interfaces IF3 to IF6 over the oxide semiconductor layer 123 so that the hydrogen from the gate insulating layer 118 under the oxide semiconductor layer 123 and the hydrogen from the etch stopper 128 and the passivation layer 140 over the oxide semiconductor layer 123 can be blocked.

Although the hydrogen absorbing layer is formed on the substrate 110 having a staggered type TFT Tr in the first embodiment, the hydrogen absorbing layer may be formed on a substrate having a coplanar type TFT in another embodiment.

Figure 3:
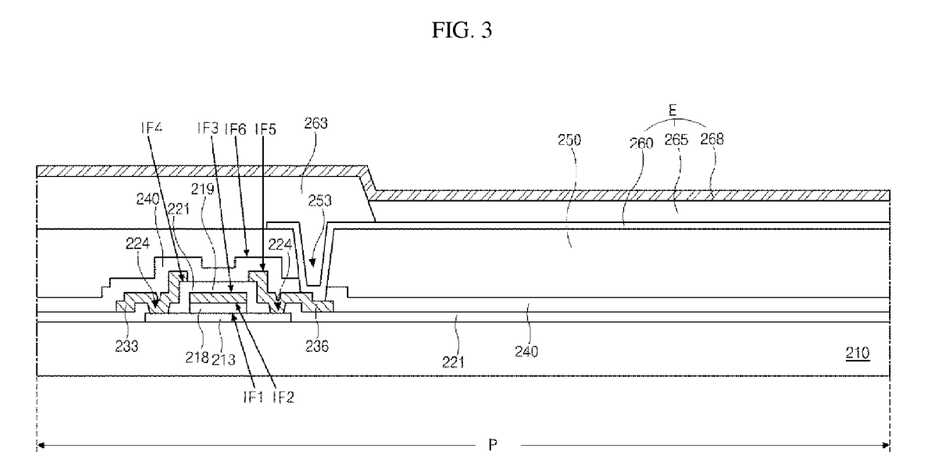
FIG. 3 is a cross-sectional view showing interfaces for a hydrogen absorbing layer of an array substrate according to a second embodiment of the present invention.

FIG. 3 is a cross-sectional view showing interfaces for a hydrogen absorbing layer of an array substrate according to a second embodiment of the present invention.

In FIG. 3, a coplanar type thin film transistor (TFT) Tr is formed on a substrate 210. The TFT Tr includes an oxide semiconductor layer 213, a gate insulating layer 218, a gate electrode 219, an interlayer insulating layer 221 and source and drain electrodes 233 and 236. The interlayer insulating layer 221 includes semiconductor contact holes 224 exposing both end portions of the oxide semiconductor layer 213, and the source and drain electrodes 233 and 236 spaced apart from each other are connected to the oxide semiconductor layer 213 through the semiconductor contact holes 224.

A passivation layer 240 of an inorganic insulating material is formed on the TFT Tr, and a planarization layer 250, a bank layer 263 and a light emitting diode E are formed on the passivation layer 240. Although not shown, a buffer layer of an inorganic insulating material may be formed between the substrate 210 and the oxide semiconductor layer 213.

Although not shown, a hydrogen absorbing layer may be formed in at least one of a first interface IF1 between the oxide semiconductor layer 213 and the gate insulating layer 218, a second interface IF2 between the gate insulating layer 218 and the gate electrode 219, a third interface IF3 between the gate electrode 219 and the interlayer insulating layer 221, a fourth interface IF4 between the interlayer insulating layer 221 and the source and drain electrodes 233 and 236, a fifth interface IF5 between the source and drain electrodes 233 and 236 and the passivation layer 240 and a sixth interface IF6 between the passivation layer 240 and the planarization layer 250. Accordingly, the hydrogen absorbing layer may be formed on at least one of top and bottom surfaces of the gate insulating layer 218, top and bottom surfaces of the interlayer insulating layer 221 and top and bottom surfaces of the passivation layer 240.

For example, the hydrogen absorbing layer may be formed in at least one of the first to sixth interfaces IF1 to IF6 over the oxide semiconductor layer 213 so that the hydrogen from the gate insulating layer 218, the interlayer insulating layer 221 and the passivation layer 240 over the oxide semiconductor layer 213 can be blocked.

The hydrogen absorbing layer may include a metallic material such as nickel (Ni), palladium (Pd) and platinum (Pt) and may have a thickness of about 0.1 Å to about 9 Å, preferably about 0.1 Å to about 5 Å such that the hydrogen absorbing layer have particles 121 of the metallic material separated from each other.

In the array substrate according to a second embodiment of the present invention, the hydrogen absorbing layer of a metallic material having a relatively high affinity with a hydrogen may be formed under or over the inorganic insulating layer 218, 221 and 240 having a hydrogen. The hydrogen absorbing layer may include one of nickel (Ni), palladium (Pd) and platinum (Pt). In addition, the hydrogen absorbing layer may have a thickness of about 0.1 Å to about 9 Å, preferably about 0.1 Å to about 5 Å, to have particles separated from each other. Since the hydrogen from the inorganic insulating layer 218, 221 and 240 is absorbed by the hydrogen absorbing layer, permeation of the hydrogen from the inorganic insulating layer 218, 221 and 240 into the oxide semiconductor layer 213 is restrained. As a result, deterioration of an oxide semiconductor layer 213 due to inflow of the hydrogen is prevented and deterioration in property of the TFT Tr is prevented. Further, since a negative shift of a current and voltage property of the TFT Tr is prevented, deterioration in display quality due to ununiform brightness is prevented.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An array substrate comprising:
   a substrate including a pixel region;
   a thin film transistor in the pixel region, the thin film transistor including a gate electrode, an oxide semiconductor layer and source and drain electrodes spaced apart from each other, wherein a first insulating layer of an inorganic insulating material is disposed between the gate electrode and the oxide semiconductor layer, and wherein a second insulating layer of an inorganic insulating material is disposed between the oxide semiconductor layer and the source and drain electrodes;
a passivation layer on the thin film transistor, the passivation layer having a drain contact hole exposing the drain electrode;
a first electrode on the passivation layer in the pixel region, the first electrode connected to the drain electrode through the drain contact hole; and
a first hydrogen absorbing layer on at least one of top and bottom surfaces of the first insulating layer, at least one of top and bottom surfaces of the second insulating layer, or at least one of top and bottom surfaces of the passivation layer, the first hydrogen absorbing layer including a plurality of particles spatially and electrically separated from each other, the plurality of particles including one of nickel, palladium and platinum,
wherein the oxide semiconductor layer directly and physically contacts the first hydrogen absorbing layer.

2. The array substrate of claim 1, wherein the first hydrogen absorbing layer is configured to absorb a hydrogen diffused from the first insulating layer, the second insulating layer and the passivation layer to constitute an interstitial compound storing the hydrogen.

3. The array substrate of claim 2, wherein the interstitial compound has an insulation property.

4. The array substrate of claim 1, wherein the first insulating layer is a gate insulating layer between the gate electrode and the oxide semiconductor layer and the second insulating layer is an etch stopper between the oxide semiconductor layer and the source and drain electrodes.

5. The array substrate of claim 4, wherein the etch stopper has one of an island shape covering a central portion of the oxide semiconductor layer and a plate shape covering an entire surface of the substrate having the oxide semiconductor layer with semiconductor contact holes exposing end portions of the oxide semiconductor layer.

6. The array substrate of claim 1, wherein the first insulating layer is a gate insulating layer between the oxide semiconductor layer and the gate electrode and the second insulating layer is an interlayer insulating layer between the gate electrode and the source and drain electrodes.

7. The array substrate of claim 6, further comprising a buffer layer of an inorganic insulating material between the substrate and the oxide semiconductor layer.

8. The array substrate of claim 7, further comprising a second hydrogen absorbing layer on one of top and bottom surfaces of the buffer layer, wherein the second hydrogen absorbing layer includes a plurality of particles spatially and electrically separated from each other and the plurality of particles include one of nickel, palladium and platinum.

9. The array substrate of claim 1, further comprising:
a bank layer on the first electrode, the bank layer covering a boundary portion of the first electrode contacting the drain electrode;
an emitting material layer on the first electrode; and
a second electrode on the emitting material layer.

10. The array substrate of claim 9, further comprising a planarization layer on the passivation layer, wherein the planarization layer and the passivation layer have the drain contact hole and the first electrode is disposed on the planarization layer.

11. The array substrate of claim 10, further comprising a color filter layer between the passivation layer and the planarization layer.

12. A method of fabricating an array substrate, comprising:
forming a thin film transistor in a pixel region on a substrate, the thin film transistor including a gate electrode, an oxide semiconductor layer and source and drain electrodes spaced apart from each other, wherein a first insulating layer of an inorganic insulating material is disposed between the gate electrode and the oxide semiconductor layer, and wherein a second insulating layer of an inorganic insulating material is disposed between the oxide semiconductor layer and the source and drain electrodes;
forming a passivation layer on the thin film transistor, the passivation layer having a drain contact hole exposing the drain electrode;
forming a first electrode on the passivation layer in the pixel region, the first electrode connected to the drain electrode through the drain contact hole; and
forming a first hydrogen absorbing layer on at least one of top and bottom surfaces of the first insulating layer, at least one of top and bottom surfaces of the second insulating layer, or at least one of top and bottom surfaces of the passivation layer, the first hydrogen absorbing layer including a plurality of particles spatially and electrically separated from each other, the plurality of particles including one of nickel, palladium and platinum,
wherein the oxide semiconductor layer of the thin film transistor is formed directly and physically contacting the first hydrogen absorbing layer.

13. The method of claim 12, wherein forming the first hydrogen absorbing layer includes depositing a metallic material including one of nickel, palladium and platinum such that the first hydrogen absorbing layer has a thickness of about 0.1 Å to about 9 Å.

14. The method of claim 12, wherein the first insulating layer is a gate insulating layer between the gate electrode and the oxide semiconductor layer and the second insulating layer is an etch stopper between the oxide semiconductor layer and the source and drain electrodes.

15. The method of claim 12, wherein the first insulating layer is a gate insulating layer between the oxide semiconductor layer and the gate electrode and the second insulating layer is an interlayer insulating layer between the gate electrode and the source and drain electrodes.

16. The method of claim 15, further comprising forming a buffer layer of an inorganic insulating material between the substrate and the oxide semiconductor layer.

17. The method of claim 16, further comprising forming a second hydrogen absorbing layer on one of top and bottom surfaces of the buffer layer, wherein the second hydrogen absorbing layer includes a plurality of particles spatially and electrically separated from each other and the plurality of particles include one of nickel, palladium and platinum.

18. The method of claim 12, further comprising:
forming a bank layer on the first electrode, the bank layer covering a boundary portion of the first electrode contacting the drain electrode;
forming an emitting material layer on the first electrode; and
forming a second electrode on the emitting material layer.

19. The method of claim 18, further comprising forming a planarization layer on the passivation layer, wherein the planarization layer and the passivation layer have the drain contact hole and the first electrode is disposed on the planarization layer.

20. The method of claim 19, further comprising forming a color filter layer between the passivation layer and the planarization layer.

* * * * *